United States Patent
Sharma et al.

[11] Patent Number: 5,878,051
[45] Date of Patent: Mar. 2, 1999

[54] ASSEMBLY-LEVEL BIST USING FIELD-PROGRAMMABLE GATE ARRAY

[75] Inventors: Shanti Swaroop Sharma, Marlton; Richard James Tarzaiski, Magnolia, both of N.J.

[73] Assignee: Lockheed Martin Corp., Moorestown, N.J.

[21] Appl. No.: 795,211

[22] Filed: Feb. 5, 1997

[51] Int. Cl.$^6$ ............................................. G01R 31/28
[52] U.S. Cl. .................... 371/22.1; 371/22.5; 371/22.6
[58] Field of Search .................................. 371/22.1, 22.2, 371/22.5, 22.6

[56] References Cited

U.S. PATENT DOCUMENTS 5,381,348  1/1995  Ernst et al. .............................. 364/514
5,623,501  4/1997  Cooke et al. ............................. 371/22.2

*Primary Examiner*—Hoa T. Nguyen
*Attorney, Agent, or Firm*—W. H. Meise; S. A. Young

[57] ABSTRACT

An assembly of logic devices intercommunicates, at least in part, by way of a data and address bus, which may not be accessible from outside the assembly. Consequently, the various logic devices, such as memories and other logic functions, cannot be directly tested. The assembly includes a field-programmable gate array (FPGA), which is programmed to perform a particular function during normal operation of the assembly. The FPGA is reconfigured during a test mode of operation into a built-in self-test (BIST) device capable of testing the various logic devices, without requiring significantly more resources on the assembly.

5 Claims, 3 Drawing Sheets

ASSEMBLY-LEVEL BIST USING FIELD-PROGRAMMABLE GATE ARRAY

STATEMENT OF GOVERNMENT INTEREST

The invention herein was made in relation to contract number DAAL01-93-C-3380 with DARPA. The Government has rights in this invention.

FIELD OF THE INVENTION

This invention relates to the testing of complex assemblages of logical functions, such as integrated circuits or printed-circuit boards containing many logical functions such as RAM, ROM, multipliers, and the like, and more specifically to testing of the various logical functions by built-in self-tester (BIST) under the control of a test bus.

BACKGROUND OF THE INVENTION

In the past, many specialized logical functions have required dedicated, special-purpose equipments, as for example military controllers, computers, and communications equipment, and those intended for aircraft and spacecraft. The cost of such specialized equipment was previously acceptable in view of the high standards and specialized requirements for such equipment. The specialized requirements might include such considerations as self-testing of each logical function of an assemblage, to thereby verify the entire system. The art of manufacturing integrated circuits for the commercial computer market has advanced so far that, in some cases, the quality and gross performance of commercial logical circuits or functions is equal to, or even superior to, specially-made functions, and due to manufacturing volume, the prices may be much lower for the commercial logic functions. However, the commercial logical functions may not have all of the desired functionalities as those required for specialized high-reliability applications.

U.S. Pat. No. 4,862,072, issued Aug. 29, 1989 in the name of Harris et al. describes a self-test arrangement for an LSI chip containing a number of logical processors. The Harris et al. arrangement uses a plurality of multiplexers connected at various points in the interconnected logical functions to route test signals to certain portions of the circuit, and to couple the resulting response of the portions being tested to an external test bus. As described in the Harris et al. patent, the test bus includes four data paths, and test signals and commands are applied over the four data paths in a manner which allows independent testing of those portions of the processing lying between multiplexers.

Another test bus standard in current use is the IEEE Joint Test Action Group (JTAG) standard. The JTAG standard data rate is so much slower than the speeds at which modern commercial logic functions operate, however, that assemblages including large commercial DRAM, DRAM, ROM, FIFO, multipliers, adders, and the like, may not be testable within reasonable times using JTAG. Nevertheless, for military, aircraft, emergency communication equipment, and the like, the reliability requirements may be such as to require self-test. When the assemblage of equipment communicates among the elements of the assemblage by way of a data bus, it is but a simple matter to connect specialized testers to the bus, to individually test the various elements.

However, in some assemblages, the communication bus may not be externally accessible. This might occur, for example, in a densely packed assemblage containing large numbers of functional elements in the form of solid-state chips. One example of such an assemblage is the high-density interconnect described, for example, in various U.S. patents assigned to Lockheed Martin Corporation or to predecessors thereof, such as U.S. Pat. No. 5,552,633, issued Sep. 3, 1996 in the name of Sharma, in which the interconnections among the various chips are made by multiple layers of printed dielectric film overlying the assemblage.

In an arrangement in which the communication bus by which the various logical functions communicate is not externally accessible, specialized high-speed testers cannot be used to directly test the various logical functions. The speed of the test bus, however, may be insufficient to allow direct testing in a reasonable time of each of the possibly millions of gates of each of tens or hundreds of logical functions. Improved self-test arrangements are desired.

SUMMARY OF THE INVENTION

An assemblage of electronic equipments or devices according to the invention communicates by means of a communication bus, at least part of which is not accessible external to the assemblage. The assemblage may be, for example, an integrated circuit, a printed-circuit board with parts mounted thereon, a high-density interconnect substrate with a plurality of semiconductor chips interconnected by layers of printed dielectric, and the like. The assemblage includes built-in self-test (BIST) adaptable for use with an external test bus, which may be, for example, a JTAG 1149 bus, and the assemblage also includes a communication bus including at least an address or data bus portion which is not accessible from outside the assemblage, so that the individual devices cannot be directly accessed for test. Representative logical functions which can be proviced by the devices coupled to the communication bus include SRAM, DRAM, adders, multipliers, FIFO, and the like. A first device for performing a first logical function is coupled to the bus, with the first logical function having a known input-output characteristic when the device is operating properly. A second device for performing a second logical function is coupled to the bus, with the second logical function having a known input-output characteristic, different from that of the first logical function, when the second device is operating properly. A field-programmable gate array coupled to the bus. The field-programmable gate array can be configured to include an external test bus port adapted to be coupled to an external test bus. The field-programmable gate array is reconfigurable into at least first and second configurations in response to test signals applied to the external test bus port, with the first and seocond configurations operable in first and second modes of operation, respectively. The first mode of operation is one which applies test signals from the field-programmable gate array over the communication bus to the first logical function, and compares response signals generated by the first logical function with a known response to determine the functional state of the first logical function, and the second mode of operation is one in which the field-programmable gate array applies test signals over the communication bus to the second logical function, and compares response signals generated by the second logical function with a known response to determine the functional state of the second logical function.

In a particular embodiment of the invention, the first logical function is a memory having a memory dimension, and the second logical function is a memory having a different value of the memory dimension. In this embodiment, the field-programmable gate array, when configured in one of the first and second modes of operation, includes (a) a built-in self-test controller for one of the first and second logical functions, which generates the test signals including at least addresses and data words, and which compares the data words with the response signals, or (b) a coupling arrangement coupled to the built-in self-test controller and to the address/data portions of the communication bus, for coupling the test signals to the first and second logical functions. The coupling arrangement further includes a coupling to the communication bus, for coupling enabling signals to one or the other of the first and second logical functions, but not to both.

A method is also described for operating an assemblage of logical functions, including a field-programmable gate array function, which intercommunicate by means of a communication bus including an address/data bus portion, in which at least the address/data bus portion of the communication bus is not accessible from the exterior of the assemblage. The method includes the step of configuring the field-programmable gate array into a configuration adapted to perform a particular function, which is not self-test of the assemblage, during a normal operating mode of the assemblage. The assemblage is operated in the normal mode, with the field-programmable gate array configured to perform the particular function. Following the step of operating the assemblage in the normal mode, the field-programmable gate array is reconfigured into a tester configuration for testing a first type of logical function which is coupled to the communication bus. The assemblage, including the field-programmable gate array configured as a tester for the first type of logical array, is operated in a manner which tests one of the first logical functions. When the test is complete, a report is issued in relation to the functioning of that logical function, as for example "Memory number twelve is functional" or "Memory number twelve is nonfunctional." Many of the first logical functions may be tested in this first mode; this means that a first ten megabyte (10 M) memory may be tested and reported on, then a second 10 M memory is tested, and then, in sequence, all of the other 10 M memories. After the step of operating the assemblage and the field-programmable gate array as tester for testing the first type of logical function, the field-programmable gate array is reconfigured to either perform the particular function in the normal operating mode, or to perform a test on a second type of logical function in a further self-test operating mode. Thus, the FPGA is reconfigured into either (a) the configuration adapted to perform a particular function which is not a self-test or (b) a tester configuration for testing a second type of logical function which is coupled to the communication bus. The assemblage, including the field-programmable gate array configured as one of (a) the configuration adapted to perform a particular function which is not a self-test and (b) a tester configuration for testing a second type of logical function which is coupled to the communication bus, is operated in one of (a) the normal mode and (b) in a manner which tests one of the second logical functions, respectively. Thus, the assemblage can be operated in its normal operating mode, and then the FPGA can be reconfigured to test one device of one type, many devices of one type, or one device each of many types, or many devices of many types, following which normal operation can be resumed.

DESCRIPTION OF THE INVENTION

Figure 1:
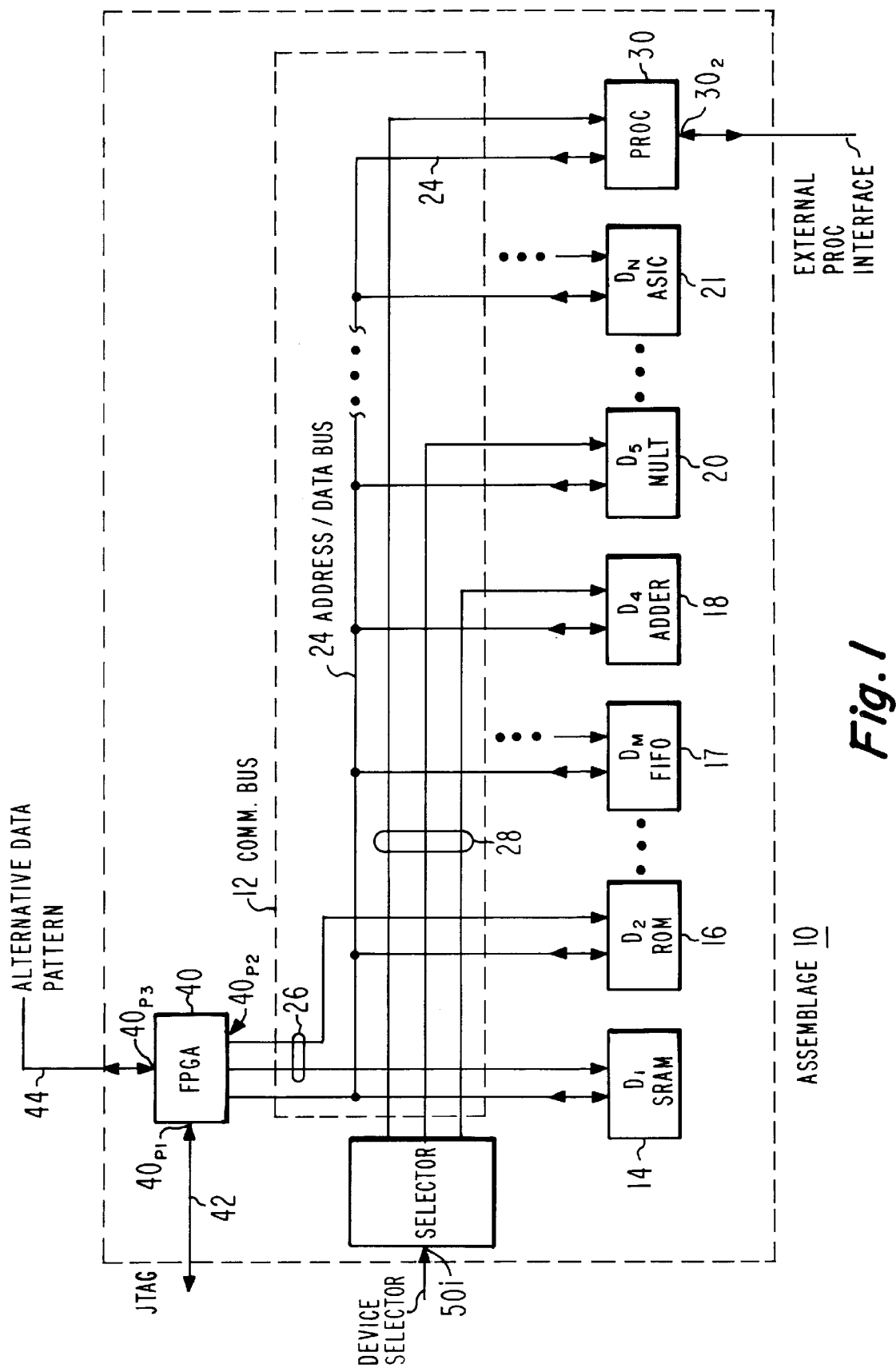
FIG. 1 is a simplified block diagram of an assemblage of logic or functional elements coupled to a communication bus, with a built-in field-programmable self-test arrangement.
Figure 2:
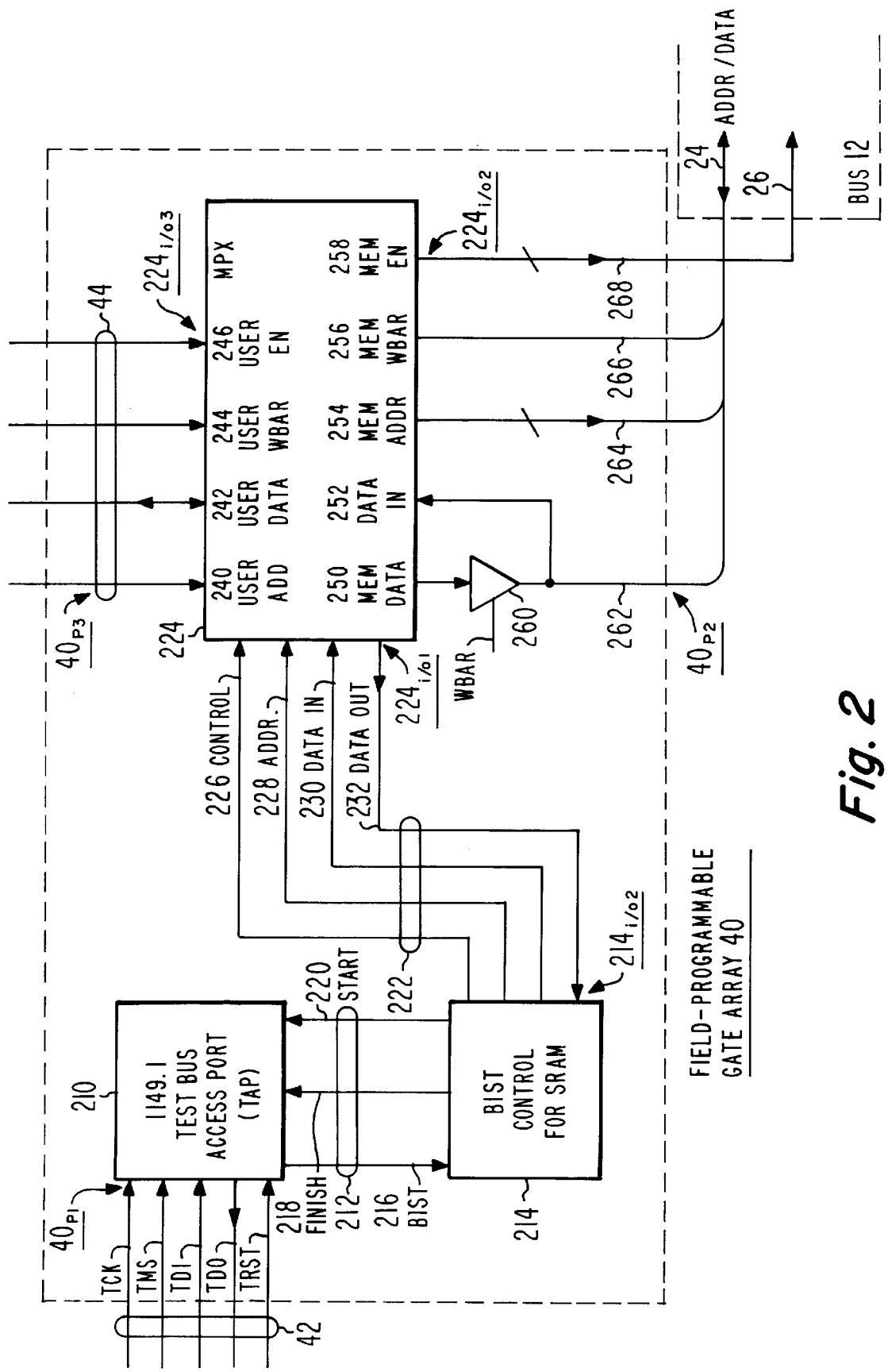
FIG. 2 is a simplified block diagram of the field-programmable self-test arrangement of FIG. 1.

In FIG. 1, an assemblage 10 of logical functions includes a communication or data bus 12, which includes an address/data bus portion 24, an internal control bus portion 26, and an external control bus portion 28. Assemblage 10 also includes a plurality of separate devices or functionalities such as a static RAM (SRAM) 14, a read-only memory (ROM) 16, a dynamic random access memory (DRAM) 18, a first-in, first out (FIFO) circuit 17, an adder 18, a multiplier (MULT) 20, and a application specific integrated circuit (ASIC) 21, which are selected to be representative of the kinds of circuits or functionalities which may be tested in accordance with an aspect of the invention, in that they have known input-output functions. Since the exact nature of the various devices 14, 16, 17, 18, 20, and 21, and their number, are not essential to the invention, the blocks or devices are denominated $D_1, D_2, \ldots, D_M, D_4, D_5, \ldots, D_N$, respectively. There is no need for the various devices to be of different types, as is illustrated in FIG. 2, and so various ones of the devices could be dynamic ram, for example. The address/data portion 24, and the internal control bus portion 26, of communication bus 12 are not accessible from outside the assemblage 10, and as consequence, it is not possible to directly address and test the various devices $D_1, D_2, \ldots, D_M$. A microprocessor (Proc.) 30 is also coupled to communication bus 12, but its transfer function may be too complex for testing in accordance with the invention. The inputs and outputs of the assemblage 10 may be applied to, and taken from, the processor 30, as for example by a processor interface port, illustrated as $30_2$.

A field-programmable gate array (FPGA) 40 is coupled at a port $40_{P2}$ to the address/data portion 24 and the internal control portion 26 of communication bus 12, and FPGA 40 also includes a test bus port $40_{P1}$ which, in use, is intended to be coupled to a test bus, illustrated as 42. The presently preferred test bus is a standard IEEE JTAG 1149.1 test bus. According to an aspect of the invention, the field-programmable gate array 40 is reconfigurable in response the test bus signals, to form, from time to time, a special-purpose tester for any one of the SRAM 14, ROM 16, FIFO 17, adder 18, multiplier 20, ASIC 21, or for any other functionality having a known input-output transfer function, suggested by ellipses in FIG. 1, which may be connected to communication bus 12.

According to another aspect of the invention, FPGA 40 is also reconfigurable to perform some function other than device testing during normal (non-testing) operation of the assemblage. Such an additional function might be, for example, translating between different codes on communication bus 12 and another bus 44, which may be coupled to a further port $40_{P3}$. As an alternative configuration, port $40_{P3}$ may receive test data over bus 44, instead of receiving the test data over JTAG bus 42. The FPGAs are conventional devices, readily available, for example, as the XC4000 series, from XILINX company, 2100 Logic Drive, San Jose, Calif. 95124-3400, tel (408) 559-7778.

The assemblage or arrangement 10 of FIG. 1 also includes a selector block 50 which includes a device selector input port 50i which is accessible from the exterior of assemblage 10. Port 50i allows selection of those devices or functionalities $D_4, D_5, \ldots, D_N$ which are to be enabled andor disabled by means of external control bus portion 28 of communication bus 12. Internal control bus portion 26 of communication bus 12 similarly provides enable-disable control of devices or functionalities $D_1, D_2, \ldots, D_M$. While both internal and external enable-disable control are described for generality, either may be used to the exclusion of the other in particular applications.

FIG. 2 is a simplified block diagram of field-programmable gate array 40 of FIG. 1. In FIG. 2, the JTAG bus 42 coupled to input port $40_{P1}$ is illustrated as containing five signal paths, designated test clock (TCK), test mode select (TMS), test data in (TDI), test data out (TDO), and test reset (trst). It should be noted that while the names of these various signal paths as given correspond to the IEEE standard, the signals themselves may be used for various purposes, as for example the "data in" may be used to define reconfiguration information for the gate array. The various signals on test bus 42 flow in the directions indicated by the arrowheads, to and from a block 210, which represents a test access port (TAP), which is a standard interface defined for the JTAG 1149.1 test bus. TAP block 210 is coupled by way of a bus illustrated as 212 to a first input/output port $214_{i/o1}$ of a further built-in self test (BIST) controller block 214, illustrated as being configured for controlling static ram, but which could be configured to control ROM, FIFO, adder, multiplier, ASIC, or the like. Bus 212 includes three signal paths, designated "bist" 216, "finish" 218, and "start" 220, with the direction of signal flow indicated by the associated arrowheads.

Controller 214 as configured for testing memory is preloaded with algorithms which, when initiated by particular data from TAP 210, perform four general tasks. In response to bist words applied over signal paths 216, controller 214 generates data and receives data at its second input/output port $214_{i/o2}$. More particularly, controller 214 produces control signals on signal path 216 of a bus 222, and it also produces addresses (addr) on signal path 228, and test data (data) on signal path 230, all of bus 222. Controller 214 receives data (data out) from data path 232 of bus 222, and controls the timing of writing, reading, and comparing steps, described below. Finally, controller 214 receives the data read from the device under test, and compares the data written with the data read, to determine functionality of the devices being tested. The signals produced at second input/output port $214_{i/o2}$ of BIST controller 214 are coupled by way of a further bus 232 to an input/output port $224_{i/o1}$ of a multiplexer (MPX) 224. The direction of signal flow on the various signal paths of bus 222 is indicated by the associated arrowhead. Multiplexer 224 includes an additional five-terminal port $224_{i/o2}$ and four-terminal port $224_{i/o3}$. It should be noted that third input/output port $224_{i/o3}$ of multiplexer 224 corresponds exactly to port $40_{P3}$ of FPGA 40, and either designation may be used. Similarly, second input/output port $224_{i/o2}$ of multiplexer 224 somewhat corresponds to port $40_{P2}$ of FPGA 10, but the designations cannot be used interchangeably, because the ports are not identical.

Port $224_{i/o2}$ of multiplexer 224 of FIG. 2 as configured for memory control or test includes a memory data (mem data) output port 250, which is coupled to the input of a buffer 260, and the output of buffer 260 is coupled by way of a path 262 to a memory data (mem data) input port 262 of input/output port $224_{i/o2}$ of multiplexer 224 in a conventional arrangement for converting or coupling two unidirectional ports (250 and 252) to an equivalent bidirectional signal path. Thus, signal path 262 is a bidirectional path which carries the data portion of the address/data path 24 on communication bus 12. The memory address port 254 of multiplexer 224 of FIG. 2 is coupled to a signal path 264, which carries the memory address information on communication bus 12. The signal "wbar" at port 256 of multiplexer 224 sets the state of the associated memory, which is to be controlled to perform a read function when wbar is high, and to write when wbar is low. Thus, there may be as many wbar signals as there are memories $D_1, D_2, \ldots, D_M$ to be tested, or the wbar signal may be applied to all of the memories in parallel, so that only one signal path 266 is necessary to control all of the memories, as illustrated in FIG. 2. The wbar signal in the illustrated arrangement may be considered to be part of the address/data signals, and the signal paths 266 for wbar are combined together into bus portion 24 of communication bus 12. Similarly, the memory enable (mem en) signals on port 258 enable or disable the various memories, and in the test mode, only one memory at a time should be enabled. Thus, one memory enable signal path is necessary for each memory coupled to the bus, so signal path 268 is illustrated with a slash representing multiple lines.

As mentioned above, ports $40_{P3}$ and $224_{i/o3}$ of FIG. 2 are identical, and comprise four individual signal paths, designated "user address" (user add) 240, "user data" 242, "user wbar" 244, and "user enable" (user en) 246, with the direction of signal flow in each signal path being indicated by the associated arrowheads.

Before beginning explanation of the operation of the arrangement of FIGS. 1 and 2, it should be noted that field programmable gate array 40 is essentially a "blank page" in the absence of, or before, configuration. In the "blank page" state, the FPGA is no more than a grouping of unconnected gates or other basic electronic devices, with no discernible purpose. Thus, if the power to the assemblage 10 is interrupted, the configuration of FPGA 40 is lost, and it must be initially configured or "reconfigured" to the desired state before it can do anything. In the described embodiment, the configuration information is applied by way of the test bus 42, which means that the configuration information required for the ordinary operating state of FPGA, for the memory self-test state, for the FIFO self-test state, and for the self-test states of the FPGA 40 as required for testing any known device 14–21, where the hyphen represents the word "through," is stored in an outboard memory. Those skilled in the art know that the configuration information could also be stored on-board the assemblage in some form of ROM, such as a UV-erasable ROM, or in nonvolatile RAM. The described embodiment, however, has the advantage that it requires no additional resources (other than the outboard configuration information) to perform self-test in addition to the function which it ordinarily performs. Thus, an assemblage such as that illustrated, with a field-programmable gate array, can be arranged to perform self-test without requiring significant additional resources on the assemblage itself.

In typical (non-test) operation of the assemblage or apparatus 10 of FIGS. 1 and 2, that portion of FPGA 40 designated as multiplexer 224 may be configured as a translator, which converts data arriving at port 252 to a different convention or standard, and which sends the translated data out of port $224_{i/o3}$ and by way of bus 44 to a user apparatus (not illustrated). In this ordinary operating state, the portions of FGPA 40 designated as 210 and 214 may simply not exist as interconnected entities, not having been programmed into existence (although the unconnected gates themselves continue to exist). Switching from the ordinary operating state to the self-test condition requires reprogramming the FPGA 40 to the state illustrated in FIG. 2.

Figure 3:
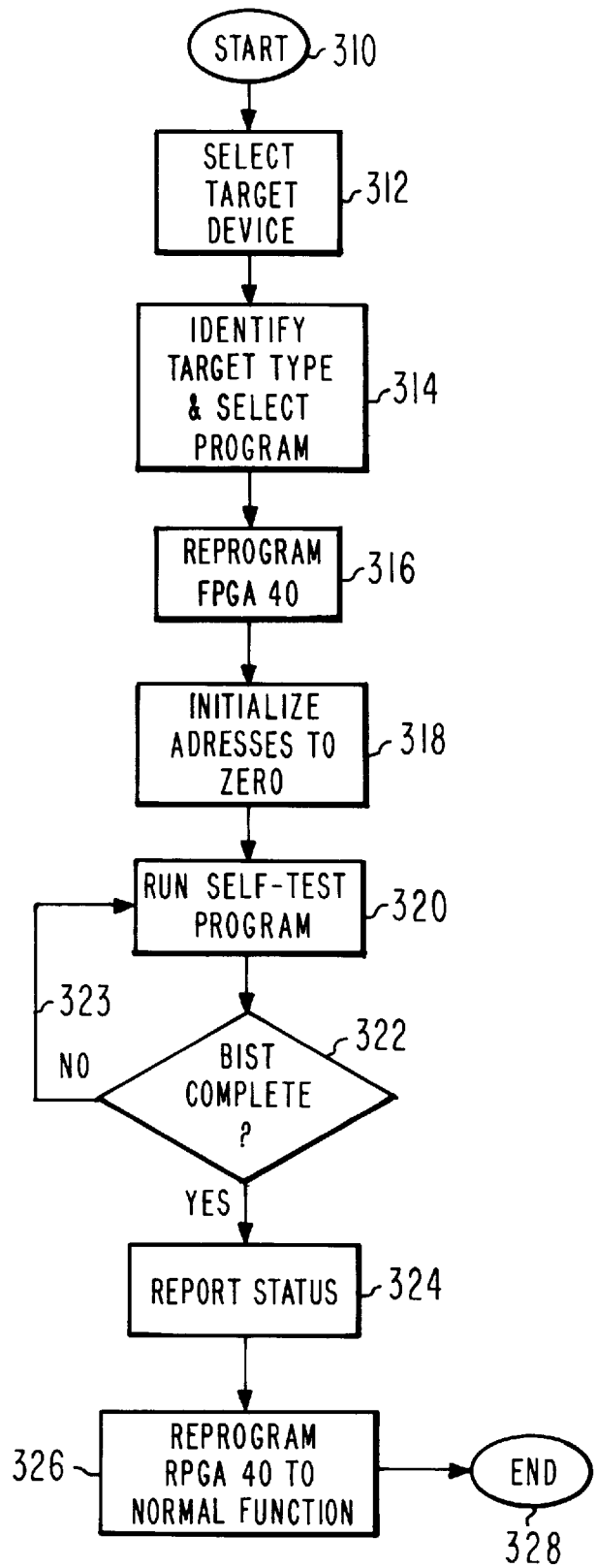
FIG. 3 is a simplified flow chart illustrating the operation of the arrangement of FIGS. 1 and 2.

FIG. 3 is a simplified flow chart illustrating the procedure for changing over from ordinary operation to the self-test mode. In FIG. 3, the logic starts at a START block 310, and flows to a block 312, which represents selection of the target device which is to be tested, as by designating "item 16 of FIG. 1." The logic flows from block 312 to a further block 314, which represents identification of the type of device which is to be tested, which may come from a simple table listing device 16 as a "ROM." Block 316 of FIG. 3 represents selection of the appropriate configuration of FPGA 40 for testing of a memory, and reconfiguration of the FPGA. The reconfiguration causes at least blocks 214 and 224 of FIG. 2 to come into existence in the illustrated form, with appropriate algorithms already programmed into block 214 of FIG. 2. Block 318 of FIG. 3 represents the initialization of the algorithms within BIST block 214 of FIG. 2 to their initial states, as for example by setting the initial memory address to be tested to the value 0000. From logic block 318 of FIG. 2, the logic flows to a further block 320, representing a command to execute the BIST program within block 214 of FIG. 2, which results, generally, in a sequence of addresses starting at 0000 being generated in block 214 of FIG. 2, and being sent, together with a serial or parallel data word, to multiplexer 224. Multiplexer 224 sends the data and the address to the selected one of the devices to be tested, and then receives the word read from the same address. The word received by multiplexer 224 is routed to BIST controller 214, which compares the original word with the received word, and verifies that they are the same, and that the memory address is functional, or determines that it is not functional if the words differ. Decision block 322 of FIG. 3 determines if the self-test of the particular device under test has been completed, and, if not, returns the logic by way of its NO output by way of a logic path 323 back to block 320, so that block 320 can continue incrementing the addresses and testing the memory. When decision block 322 determines that the last address tested corresponds with the known greatest address of the memory in question, the logic leaves decision block 322 by the YES output, and flows to a further logic block 324. Logic block 324 represents the reporting of the status of the memory device under test. From block 324, the logic flows to a further block 326, which represents the reprogramming of FPGA 40 to the configuration suited for normal operation, and the logic flow of FIG. 3 ends at a block 328.

Those skilled in the art will recognize that self-test of different types of devices, such as the FIFO and other devices described in conjunction with FIG. 1, will require reprogramming of FPGA 40 to other forms than that illustrated in FIG. 2. The particular form which the FPGA takes in its self-test mode is not of particular importance to the invention, and will be apparent to those skilled in the art, as the FPGA must be programmed to do whatever is normally done to test the particular type of device in question.

A major advantage of the described arrangement is that the self-test performed by FPGA 40 can be performed at the clock rate of the underlying device, which as mentioned may be a very high speed commercial device. Only the data required for reprogramming of the FPGA is sent at the lower clock rate of the test bus 42 or external bus 44.

As so far described, self-test of devices $D_4, D_5, \ldots, D_N$ can only be performed if external control of the self-tester aspect of FPGA 40 is coordinated with enabling control of the particular device to be tested, by way of selector 50 of FIG. 2. This configuration of testing, however, is just as fast overall as that described above, because the time required to reprogram the FPGA is the same in both cases, and the only difference is that the enable control of the particular device to be tested (multiplier 20 of FIG. 1, for example) comes from the selector 50 rather than from the FPGA 40.

Thus, an assemblage (10) of electronic equipments or devices (14–21) communicates by means of a communication bus (12), at least part (24) of which is not accessible external to the assemblage (10). The assemblage (10) may be, for example, an integrated circuit, a printed-circuit board with parts mounted thereon, a high-density interconnect substrate with a plurality of semiconductor chips interconnected by layers of printed dielectric, or the like. The assemblage (10) includes built-in self-test adaptable for use with an external test bus (42), and includes a communication bus (12) including at least an address (264) or data (262) bus portion which is not accessible from outside the assemblage (10), so that the individual devices (14–21) cannot be directly accessed for test. A first device (14) for performing a first logical function is coupled to the bus (12), with the first logical function (static RAM) having a known input-output characteristic when the first device (14) is operating properly. A second device (16, 17, 18, 20, 21)) for performing a second logical function (ROM, FIFO, adder, multiplier, ASIC) is coupled to the bus (12), with the second logical function (16–21) having a known input-output characteristic, different from that of the first logical function, when the second device (16–21) is operating properly. A field-programmable gate array (40) is coupled to the communication bus (12). The field-programmable gate array (40) can be configured to include an external test bus port (40$_P$, 40$_{P3}$) adapted to be coupled to an external test bus (42, 44). The field-programmable gate array (40) is reconfigurable into at least first and second configurations in response to test signals applied to the external test bus port (40$_P$), with the first and second configurations operable in first and second modes of operation, respectively. The first mode of operation is one in which the FPGA applies test signals from the field-programmable gate array (40) over the communication bus (12) to the first device (14) performing the first logical function, and compares response signals generated by the first device (14) with a known response to determine the functional state of the first device (14), and the second mode of operation is one in which the field-programmable gate array (40) applies test signals over the communication bus (12) to the second device performing the second logical function, and compares response signals generated by the second device with a known response to determine the functional state of the second device performing the second logical function. In a particular embodiment of the invention, the first logical function is a memory (14) having a memory dimension (so many MBYTES) and the second logical function (16, for example) is a memory having a different value of the memory dimension. In this embodiment, the field-programmable gate array (40), when configured in one of the first and second modes of operation, includes (a) a built-in self-test controller (214) for one of the first and second logical functions, which generates the test signals including at least addresses and data words, and which compares the data words with the response signals, and (b) a coupling arrangement (224) coupled to the built-in self-test controller (214) and to at least the address/data portions (262, 264) of the communication bus, for coupling the test signals to the first and second logical devices (14, 16) or functions. The coupling arrangement (224) may further include a coupling (224) to the communication bus (12), for coupling enabling signals to one or the other of the first (14) and second (16) logical functions, but not to both.

A method is also described for operating an assemblage of logical functions, including a field-programmable gate array function, which intercommunicate by means of a communication bus including an address/data bus portion, in which at least the address/data bus portion of the communication bus is not accessible from the exterior of the assemblage. The method includes the step of configuring the field-programmable gate array into a configuration adapted to perform a particular function, which is not self-test of the assemblage, during a normal operating mode of the assemblage. The assemblage is operated in the normal mode, with the field-programmable gate array configured to perform the particular function. Following the step of operating the assemblage in the normal mode, the field-programmable gate array is reconfigured into a tester configuration for testing a first type of logical function which is coupled to the communication bus. The assemblage, including the field-programmable gate array configured as a tester for the first type of logical array, is operated in a manner which tests one of the first logical functions. When the test is complete, a report is issued in relation to the functioning of that logical function, as for example "Memory number twelve is functional" or "Memory number twelve is nonfunctional." Many of the first logical functions may be tested in this first mode; this means that a first 10 M memory may be tested and reported on, then a second 10 M memory is tested, and then, in sequence, all of the other 10 M memories. After the step of operating the assemblage and the field-programmable gate array as tester for testing the first type of logical function, the field-progammable gate array is reconfigured to either perform the particular function in the normal operating mode, or to perform a test on a second type of logical function in a further self-test operating mode. Thus, the FPGA is reconfigured into either (a) the configuration adapted to perform a particular function which is not a self-test or (b) a tester configuration for testing a second type of logical function which is coupled to the communication bus. The assemblage, including the field-programmable gate array configured as one of (a) the configuration adapted to perform a particular function which is not a self-test and (b) a tester configuration for testing a second type of logical function which is coupled to the communication bus, is operated in one of (a) the normal mode and (b) in a manner which tests one of the second logical functions, respectively. Thus, the assemblage can be operated in its normal operating mode, and then the FPGA can be reconfigured to test one device of one type, many devices of one type, or one device each of many types, or many devices of many types, following which normal operation can be resumed.

Other embodiments of the invention will be apparent to those skilled in the art. For example, while bus 12 has been illustrated as being parallel, it may also be serial, as known in the art. Where a data "word" is described, the word may be serial or parallel.

What is claimed is:

1. An assemblage of electronic equipments including built-in self-test adaptable for use with an external test bus which is external to said assemblage, said assemblage comprising;

at least a portion of a communication bus, said portion including at least address/data portions, at least part of said portion of said communication bus not being directly accessible from locations external to the assemblage:

a first apparatus for performing a first logical function, said first apparatus being coupled to said communication bus, said first apparatus having a known input-output characteristic when operating properly;

a second apparatus for performing a second logical function, said second apparatus being coupled to said communication bus, said second apparatus having a known input-output characteristic, different from that of said first apparatus, when operating properly;

a field-programmable gate array coupled to said communication bus, said field-programmable gate array including an external test bus port adapted to be coupled to said external test bus, said field-programmable gate array being reconfigurable in response to test signals applied to said external test bus port to function in at least first and second modes, said first mode being one in which test signals are applied over said communication bus to said first apparatus, and response signals generated by said first apparatus are compared with a known response to determine the functional state of said first apparatus, and said second mode being one in which test signals are applied over said communication bus to said second apparatus, and response signals generated by said second apparatus are compared with a known response to determine the functional state of said second apparatus.

2. An assemblage according to claim 1, wherein said first apparatus comprises a memory having a memory dimension, and said second apparatus comprises a memory having a different value of said memory dimension.

3. An assemblage according to claim 1, wherein said field-programmable gate array, when configured in one of said first and second modes, includes:

a built-in self-test controller for one of said first and second apparatuses, which generates said test signals including at least addresses and data words, and which compares said data words with said response signals; and coupling means coupled to said built-in self-test controller and to said address/data portions of said communication bus, for coupling said test signals to said first and second apparatuses.

4. An assemblage according to claim 3, wherein said coupling means further comprises means coupled to said communication bus, for coupling enabling signals to that one of said first and second apparatuses to be tested, but not to both.

5. A method for operating an assemblage of apparatuses for performing logical functions, including a field-programmable gate array, which intercommunicate by means of a communication bus including an address/data bus portion, in which at least said address/data bus portion of said communication bus is not accessible from the exterior of said assemblage, said method comprising the steps of:

configuring said field-programmable gate array into a configuration adapted to perform a particular function which is not self-test during a normal operating mode of said assemblage;

operating said assemblage in said normal operating mode, with said field-programmable gate array configured to perform said particular function;

following said step of operating said assemblage in said normal mode, reconfiguring said field-programmable gate array into a configuration for testing a first type of apparatus for performing a logical function which is coupled to said communication bus;

operating said assemblage, including said field-programmable gate array configured for testing said first type of apparatus for performing a logical function, in a manner which tests one of said first apparatuses for performing a logical function;

after said step of reconfiguring said field-programmable gate array for testing said first type of apparatus for performing a logical function, reconfiguring said field-programmable gate array into one of (a) said configuration adapted to perform a particular function which is not self-test and (b) a configuration for testing a second type of apparatus for performing a logical function which is coupled to said communication bus; and operating said assemblage, including said field-programmable gate array configured as one of (a) said configuration adapted to perform a particular function which is not self-test and (b) a configuration for testing a second type of apparatus for performing a logical function which is coupled to said communication bus, in one of (a) said normal mode and (b) in a manner which tests one of said second apparatuses for performing a logical function.

* * * * *